(12) United States Patent
Lan et al.

(10) Patent No.: US 10,784,892 B1
(45) Date of Patent: *Sep. 22, 2020

(54) HIGH THROUGHPUT HARDWARE UNIT PROVIDING EFFICIENT LOSSLESS DATA COMPRESSION IN CONVOLUTION NEURAL NETWORKS

(71) Applicant: Ambarella International LP, Santa Clara, CA (US)

(72) Inventors: Junqiang Lan, Fremont, CA (US); Zhijian Lu, Sunnyvale, CA (US)

(73) Assignee: Ambarella International LP, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/525,909

(22) Filed: Jul. 30, 2019

Related U.S. Application Data

(63) Continuation of application No. 16/156,132, filed on Oct. 10, 2018, now Pat. No. 10,411,727.

(51) Int. Cl.
*H03M 7/30* (2006.01)
*H03M 7/32* (2006.01)
*G06N 3/04* (2006.01)
*H03M 13/11* (2006.01)

(52) U.S. Cl.
CPC ........ *H03M 7/3035* (2013.01); *G06N 3/0454* (2013.01); *H03M 13/1117* (2013.01)

(58) Field of Classification Search
CPC ...... H03M 13/1177; H03M 7/30; H03M 7/24; H03M 7/3059; H03M 7/40; H03M 7/55; H03M 7/6011; H03M 7/6064; H03M 7/3035

USPC ........................ 375/240, 240.24, 240.25, 247
See application file for complete search history.

(56) References Cited

U.S. PATENT DOCUMENTS

| | | | |
|---|---|---|---|
| 5,867,221 A | 2/1999 | Pullen | 375/240.16 |
| 6,032,197 A | 2/2000 | Birdwell | 709/216 |
| 6,204,780 B1 | 3/2001 | Cole | 341/50 |
| 6,587,507 B1 | 7/2003 | Chui | 375/240.19 |
| 9,451,257 B2 | 9/2016 | Alfonso | |
| 10,411,727 B1 * | 9/2019 | Lan | G06N 3/0454 |
| 2002/0003905 A1 * | 1/2002 | Sato | G06T 5/002 382/240 |
| 2007/0093959 A1 | 4/2007 | Weis | 701/1 |
| 2008/0256338 A1 * | 10/2008 | Suggs | G06F 9/30152 712/213 |
| 2011/0286267 A1 * | 11/2011 | Rychlik | G11C 11/5628 365/185.03 |
| 2017/0286213 A1 | 10/2017 | Li | |
| 2018/0070095 A1 * | 3/2018 | Chou | H04N 19/137 |

(Continued)

*Primary Examiner* — Emmanuel Bayard
(74) *Attorney, Agent, or Firm* — Christopher P. Maiorana, PC

(57) ABSTRACT

An apparatus includes a first memory interface circuit and a decompression circuit coupled to the first memory interface circuit. The decompression circuit may be configured to (i) receive a reduced size representation of a coding block of data comprising a first bit map, a second bit map, and zero or more non-zero values from an external memory via the first memory interface circuit, (ii) losslessly restore the coding block of data from the reduced size representation of the coding block using the first bit map, the second bit map, and the zero or more non-zero values, and (iii) transfer the restored coding block of data to a processing circuit.

20 Claims, 12 Drawing Sheets

(56) References Cited

U.S. PATENT DOCUMENTS

2019/0034334 A1\* 1/2019 Arelakis ............... G06F 3/0608
2019/0110080 A1\* 4/2019 Said ...................... H04N 19/13

\* cited by examiner

US 10,784,892 B1

HIGH THROUGHPUT HARDWARE UNIT PROVIDING EFFICIENT LOSSLESS DATA COMPRESSION IN CONVOLUTION NEURAL NETWORKS

This application relates to U.S. Ser. No. 16/156,132, filed Oct. 10, 2018, which is incorporated by reference in its entirety.

FIELD OF THE INVENTION

The invention relates to computer and machine vision generally and, more particularly, to a method and/or apparatus for implementing a high throughput hardware unit providing efficient lossless data compression in convolution neural networks.

BACKGROUND

Modern Convolutional Neural Networks (CNNs) have achieved great success in computer vision related tasks. A CNN can outperform human beings in certain computer vision tasks. CNNs can be trained to capture highly non-linear complex features at the cost of high computation and memory bandwidth. Capturing the highly non-linear complex features involves high dimensional intermediate vectors/tensors being exchanged through dynamic random access memory (DRAM). The DRAM traffic consumes a significant amount of DRAM bandwidth and can potentially slow down the performance of a whole system.

It would be desirable to implement a high throughput hardware unit providing efficient lossless data compression in convolution neural networks.

SUMMARY

The invention concerns an apparatus including a first memory interface circuit and a decompression circuit coupled to the first memory interface circuit. The decompression circuit may be configured to (i) receive a reduced size representation of a coding block of data comprising a first bit map, a second bit map, and zero or more non-zero values from an external memory via the first memory interface circuit, (ii) losslessly restore the coding block of data from the reduced size representation of the coding block using the first bit map, the second bit map, and the zero or more non-zero values, and (iii) transfer the restored coding block of data to a processing circuit.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the present invention include providing a high throughput hardware unit providing efficient lossless data compression in convolution neural networks that may (i) be implemented as a dedicated hardware unit, (ii) be used on intermediate layers of a variety of networks (e.g., VGG, YOLO, etc.), (iii) provide data compression in a range of ~60% to ~30% of an original size, (iv) provide a novel coding block structure, (v) reduce dynamic random access memory (DRAM) bandwidth of intermediate layers of a convolutional neural network (CNN), and/or (vi) be implemented as one or more integrated circuits.

In various embodiments, a hardware friendly lossless data compression scheme is provided to reduce the dynamic random access memory (DRAM) bandwidth of intermediate layers of a convolutional neural network (CNN). The compression scheme generally does not affect CNN detection results since data may be recovered losslessly. The compression scheme has low complexity and high compression ratio. In an example, a hardware unit implementing the compression scheme in accordance with an embodiment of the invention may be implemented in silicon and achieve 16-bytes per cycle throughput.

Figure 1:
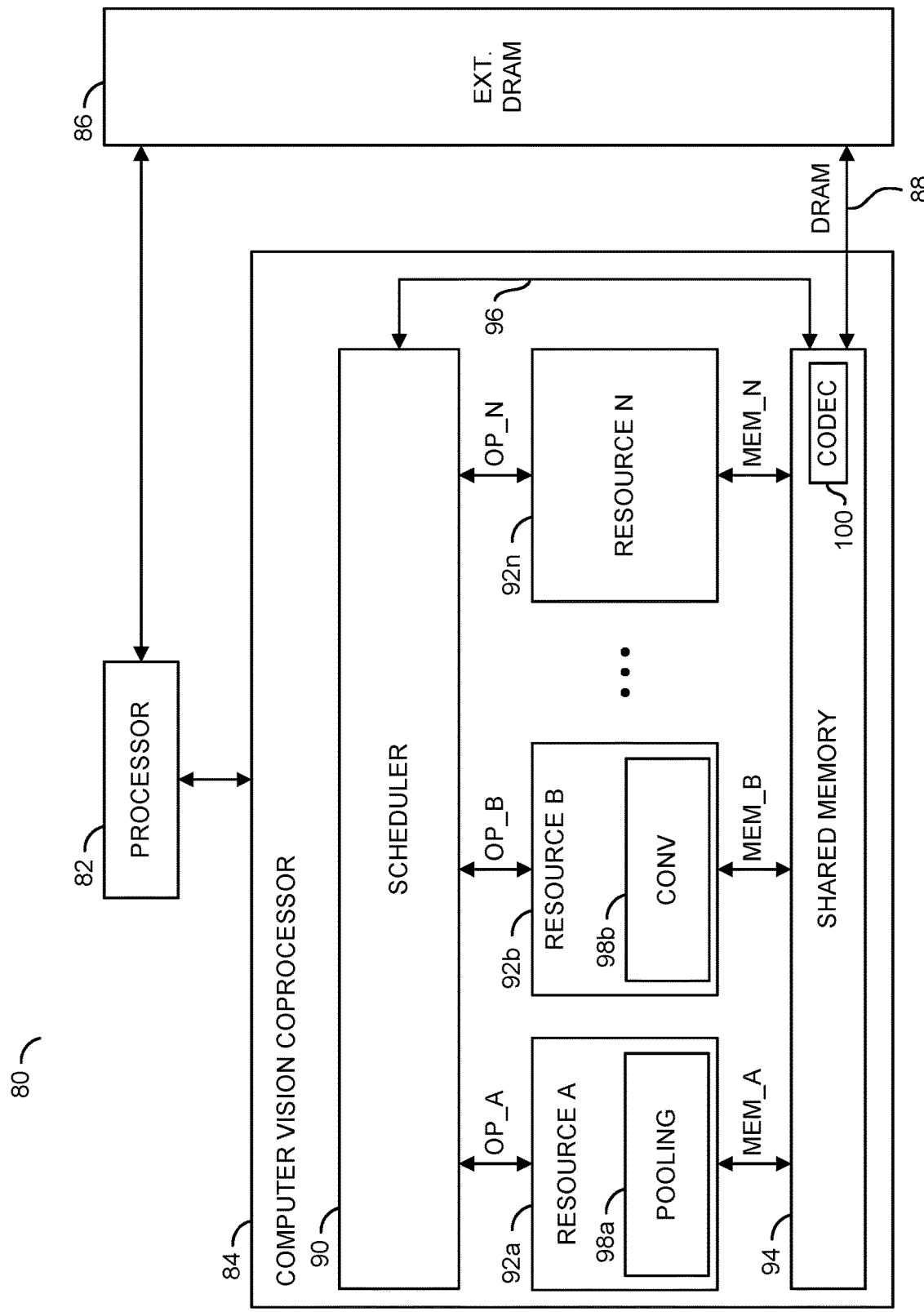
FIG. 1 is a diagram illustrating a context in which a high throughput hardware unit providing efficient lossless data compression in convolution neural networks in accordance with an example embodiment of the invention may be implemented.

Referring to FIG. 1, a diagram of a system 80 is shown illustrating a context in which a high throughput hardware unit providing efficient lossless data compression in convolution neural networks in accordance with an example embodiment of the invention may be implemented. The system (or apparatus) 80 may be implemented as part of a computer vision system. In various embodiments, the system 80 may be implemented as part of a camera, a computer, a server (e.g., a cloud server), a smart phone (e.g., a cellular telephone), a personal digital assistant, or the like. The system 80 may be configured for applications including, but not limited to autonomous and semi-autonomous vehicles (e.g., cars, trucks, agricultural machinery, drones, etc.), manufacturing, and security/surveillance systems. In contrast to a general purpose computer, the system 80 generally comprises hardware circuitry that is optimized to provide a high performance image processing and computer vision pipeline in minimal area and with minimal power consumption.

In an example embodiment, the system 80 generally comprises a block (or circuit) 82, a block (or circuit) 84, a block (or circuit) 86 and a memory bus 88. The circuit 84 generally comprises a block (or circuit) 90, one or more blocks (or circuits) 92a-92n, a block (or circuit) 94 and a pathway 96. In an example embodiment, one or more of the circuits 92a-92n may comprise a block (or circuit) 98a and a block (or circuit) 98b. In an example, the circuit 98a may implement a pooling process. In various embodiments, the circuit 98a may be utilized in implementing a region of interest pooling scheme for object detection using a convolutional neural network. An example implementation of a pooling scheme that may be used to implement the circuit 98a may be found in co-pending U.S. application Ser. No. 15/720,205, filed Sep. 29, 2017, which is herein incorporated by reference in its entirety. In an example, the circuit 98b may be configured to provide convolution calculations in multiple dimensions. An example implementation of a convolution calculation scheme that may be used to implement the circuit 98b may be found in co-pending U.S. application Ser. No. 15/403,540, filed Jan. 11, 2017, which is herein incorporated by reference in its entirety.

Multiple signals (e.g., OP_A to OP_N) may be exchanged between the circuit 90 and the respective circuits 92a-92n. Each signal OP_A to OP_N may convey execution operation information and/or yield operation information. Multiple signals (e.g., MEM_A to MEM_N) may be exchanged between the respective circuits 92a-92n and the circuit 94. The signals MEM_A to MEM_N may carry data. A signal (e.g., DRAM) may be exchanged between the circuit 86 and the circuit 94. The signal DRAM may transfer data between the circuits 86 and 94.

The circuit 82 may implement a processor circuit. In some embodiments, the processor circuit 82 may be a general purpose processor circuit. The processor circuit 82 may be operational to interact with the circuit 84 and the circuit 86 to perform various processing tasks.

The circuit 84 may implement a coprocessor circuit. The coprocessor circuit 84 is generally operational to perform specific processing tasks as arranged by the processor circuit 82. In various embodiments, the coprocessor 84 may be implemented solely in hardware. The coprocessor 84 may directly execute a data flow directed to object detection with region of interest pooling, and generated by software that specifies processing (e.g., computer vision) tasks.

In various embodiments, the circuit 86 may implement a dynamic random access memory (DRAM) circuit. The DRAM circuit 86 is generally operational to store multidimensional arrays of input data elements and various forms of output data elements. The DRAM circuit 86 may exchange the input data elements and the output data elements with the processor circuit 82 and the coprocessor circuit 84.

The circuit 90 may implement a scheduler circuit. The scheduler circuit 90 is generally operational to schedule tasks among the circuits 92a-92n to perform a variety of computer vision related tasks as defined by the processor circuit 82. Individual tasks may be allocated by the scheduler circuit 90 to the circuits 92a-92n. The scheduler circuit 90 may time multiplex the tasks to the circuits 92a-92n based on the availability of the circuits 92a-92n to perform the work.

Each circuit 92a-92n may implement a processing resource (or hardware engine). The hardware engines 92a-92n are generally operational to perform specific processing tasks. The hardware engines 92a-92n may be implemented to include dedicated hardware circuits that are optimized for high-performance and low power consumption while performing the specific processing tasks. In some configurations, the hardware engines 92a-92n may operate in parallel and independent of each other. In other configurations, the hardware engines 92a-92n may operate collectively among each other to perform allocated tasks.

The hardware engines 92a-92n may be homogenous processing resources (e.g., all circuits 92a-92n may have the same capabilities) or heterogeneous processing resources (e.g., two or more circuits 92a-92n may have different capabilities). The hardware engines 92a-92n are generally configured to perform operators that may include, but are not limited to, a resampling operator, a warping operator, component operators that manipulate lists of components (e.g., components may be regions of a vector that share a common attribute and may be grouped together with a bounding box), a matrix inverse operator, a dot product operator, a convolution operator, conditional operators (e.g., multiplex and demultiplex), a remapping operator, a minimum-maximum-reduction operator, a pooling operator, a non-minimum, non-maximum suppression operator, a gather operator, a scatter operator, a statistics operator, a classifier operator, an integral image operator, an upsample operator and a power of two downsample operator. In various embodiments, the hardware engines 92a-92n may be implemented solely as hardware circuits. In some embodiments, the hardware engines 92a-92n may be implemented as generic engines that may be configured through circuit customization and/or software/firmware to operate as special purpose machines (or engines). In some embodiments, the hardware engines 92a-92n may instead be implemented as one or more instances or threads of program code executed on the processor 82 and/or one or more processors, including, but not limited to, a vector processor, a central processing unit (CPU), a digital signal processor (DSP), or a graphics processing unit (GPU).

The circuit 94 may implement a shared memory circuit. The shared memory 94 is generally operational to store all of or portions of the multidimensional arrays (or vectors) of input data elements and output data elements generated and/or utilized by the hardware engines 92a-92n. The input data elements may be transferred to the shared memory 94 from the DRAM circuit 86 via the memory bus 88. The output data elements may be sent from the shared memory 94 to the DRAM circuit 86 via the memory bus 88. In an example, the circuit 84 may be configured to implement a convolutional neural network (CNN). A CNN may be trained to capture highly non-linear complex features. Capturing the highly non-linear complex features involves high dimensional intermediate vectors/tensors being exchanged through dynamic random access memory (DRAM) 86.

To avoid the DRAM traffic associated with CNN operations consuming a significant amount of DRAM bandwidth and potentially slowing down the performance of a whole system, the shared memory 94 may include a block (or circuit) 100. The circuit 100 may be configured to provide a high throughput hardware unit providing efficient lossless data compression in convolution neural networks in accordance with an example embodiment of the invention. The circuit 100 generally implements a compression/decompression (codec) unit between the shared memory 94 and the DRAM memory 86. The circuit 100 generally has low complexity and a high compression ratio. The circuit 100 generally reduces DRAM bandwidth of the intermediate layers of a CNN layer. The circuit 100 generally does not affect CNN detection results since data may be recovered losslessly.

The pathway 96 may implement a transfer path internal to the coprocessor 84. The transfer pathway 96 is generally operational to move data from the scheduler circuit 90 to the shared memory 94. The transfer path 96 may also be operational to move data from the shared memory 94 to the scheduler circuit 90.

The circuit 98a may implement a pooling circuit. The pooling circuit 98a may be in communication with the memory circuit 94 to receive input data and present the output data. In an example, the circuit 98a may be configured to implement a very efficient region of interest (ROI) pooling method for object detection. In an example, the circuit 98a may be used in both training and deployment phases of an object detector. The circuit 98a may support two-stage object detection networks. In an example, the circuit 98a may facilitate running CNN-based object detectors in real-time on resource-limited hardware for time-critical applications such as a self-driving vehicle. In an example, the circuit 98a may implement a pooling scheme based on a feature map pyramid and ROI resampling, which may be built on top of a generic hardware engine configured, inter alia, to perform pooling and bilinear interpolation.

The circuit 98b may implement a convolution circuit. The convolution circuit 98b may be in communication with the memory circuit 94 to receive input data, receive and present intermediate vectors/tensors, and present the output data. The convolution circuit 98b is generally operational to fetch a plurality of data vectors from the memory circuit 94. Each data vector may comprise a plurality of the data values. The convolution circuit 98b may also be operational to fetch a kernel from the memory circuit 94. The kernel generally comprises a plurality of kernel values. The convolution circuit 98b may also be operational to fetch a block from the memory circuit 94 to an internal (or local) buffer. The block generally comprises a plurality of input tiles. Each input tile may comprise a plurality of input values in multiple dimensions. The convolution circuit 98b may also be operational to calculate a plurality of intermediate values in parallel by multiplying each input tile in the internal buffer with a corresponding one of the kernel values and calculate an output tile comprising a plurality of output values based on the intermediate values. In various embodiments, the convolution circuit 98b may be implemented solely in hardware. An example of a convolution calculation scheme that may be used to implement the circuit 98b may be found in co-pending U.S. application Ser. No. 15/403,540, filed Jan. 11, 2017, which is herein incorporated by reference in its entirety.

Figure 2:
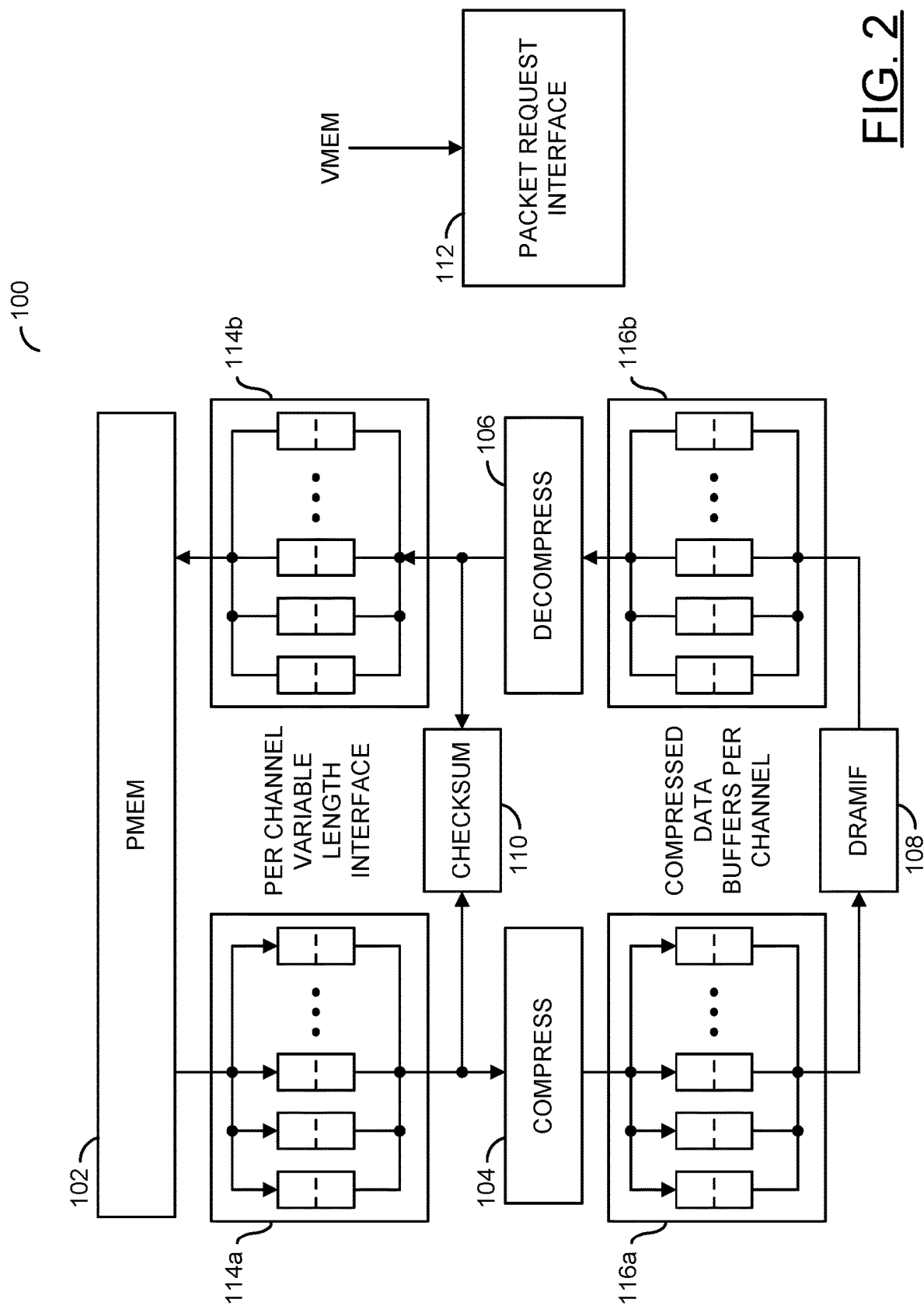
FIG. 2 is a diagram illustrating example compression and decompression pathways in accordance with an example embodiment of the invention.

Referring to FIG. 2, a diagram of the circuit 100 is shown illustrating an example implementation of a compression/decompression scheme in accordance with an embodiment of the invention. In an example, the circuit 100 may comprise a processor side memory interface (PMEM) 102, a compression unit 104, a decompression unit 106, a DRAM side interface (DRAMIF) 108, a checksum calculation block 110, and a packet request interface 112. In an example, the compression unit 104 may comprise two compression engines working in parallel and the decompression unit 106 may comprise two decompression engines working in parallel, for the purpose of achieving a desired throughput.

In an example, an output of the processor side memory interface (PMEM) 102 is coupled to an input of the compression unit 102 and a first input of the checksum calculating unit 110 by a first plurality of two-bank buffers 114a. An input of the PMEM 102 is coupled to an output of the decompression unit 106 by a second plurality of two-bank buffers 114b. The output of the decompression unit 106 is also coupled directly to a second input of the checksum calculating unit 110. An output of the compression unit 102 is coupled to an input of the DRAMIF 108 by a third plurality of two-bank buffers 116a. An output of the DRAMIF 108 is coupled to an input of the decompression unit 106 by a fourth plurality of two-bank buffers 116b.

In various embodiments, there is generally only one set of physical wires for data transactions with the processor side memory interface (PMEM) 102. In embodiments implementing only one set of physical wires for data transactions, the parallel internal structure of the circuit 100 may be transparent to circuits outside the circuit 100.

On the DRAM side, compressed data (e.g., coming from the compression unit 104 or going to the decompression unit 106) goes through the DRAM side interface (DRAMIF) 108. A signal (e.g., VMEM) may be presented to the packet request interface 112. The packet request interface 112 generates the appropriate DRAM requests. The compressed data are generally in variable-length format. Since the compressed data are in variable-length format, each channel has a corresponding two-bank buffer 116a or 116b. In an example, the buffers 116a and 116b may be implemented with 256 bytes each. However, other buffer dimensions may be implemented to meet the design criteria of a particular implementation.

In various embodiments, input data of the compression scheme may comprise either signed or unsigned elements. In an example, each input data element may be either 8-bits wide or 16-bits wide. In an example, the data stream may be chopped into fixed 128-byte packets. When the input data elements are 8-bits wide, each packet generally contains 128 elements. When the data elements are 16-bits wide, each packet generally contains 64 elements. However, other data widths and/or numbers of elements may be implemented to meet the design criteria of a particular implementation.

Figure 3:
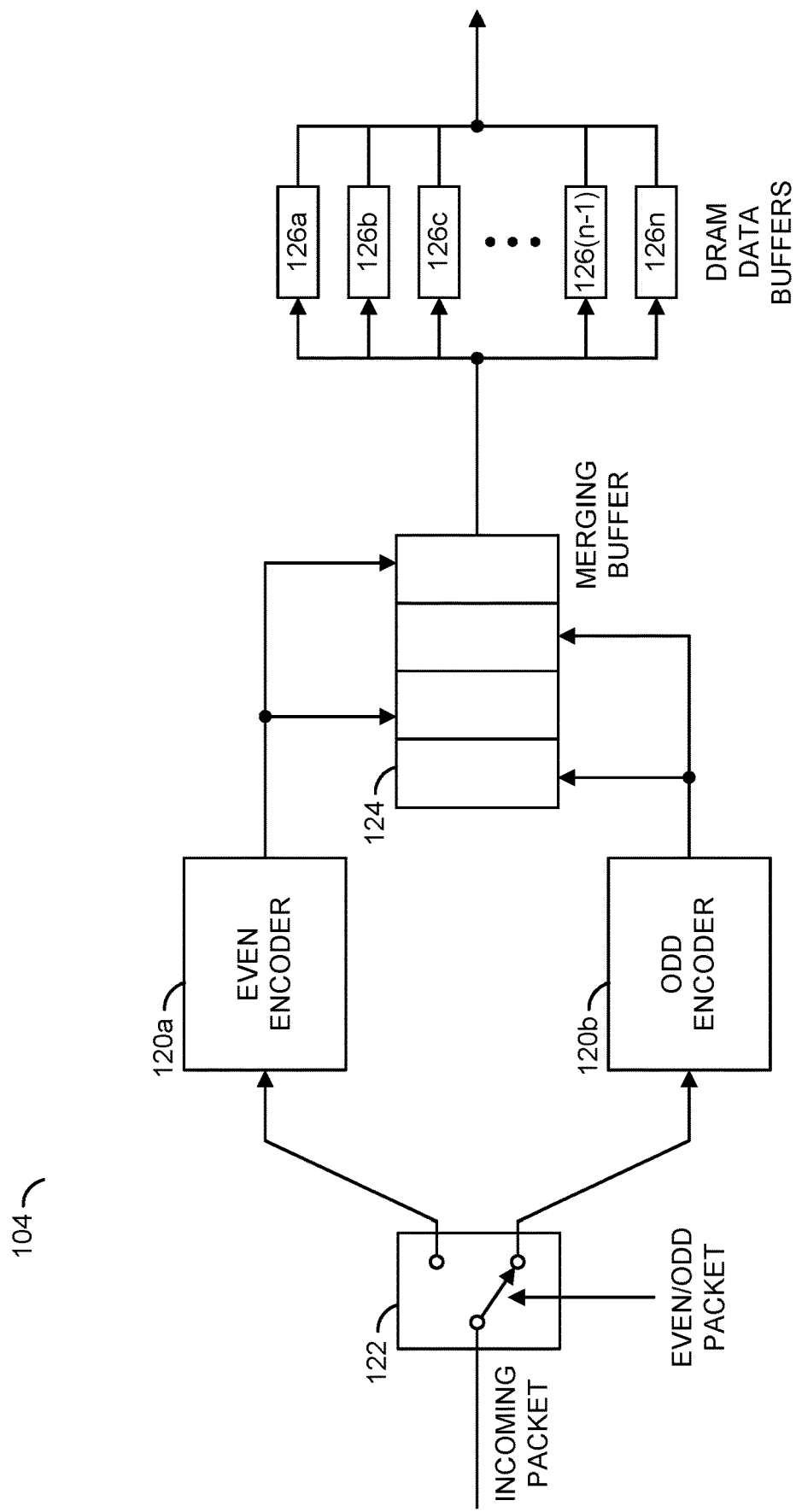
FIG. 3 is a diagram illustrating an example implementation of a compression unit of FIG. 2 in accordance with an example embodiment of the invention.

Referring to FIG. 3, a diagram is shown illustrating an example implementation of the compression unit 104 of FIG. 2 in accordance with an example embodiment of the invention. In an example, the compression unit 104 may be implemented with two encoders 120a and 120b. The encoders 120a and 120b may be operated in parallel. In an example, the interface between the PMEM 102 and the compression unit 104 may be 16-bytes wide. However, other widths may be implemented accordingly to meet design criteria of a particular implementation. In an example, 8 cycles are taken to transfer one packet. The encoding (compression) process generally takes more than 8 cycles to complete. Therefore, the two encoders 120a and 120b are generally run in parallel, allowing 16 cycles of processing time per packet.

In an example, the compression 104 may comprise the two encoders 12a and 120b, a block (or circuit) 122, a block (or circuit) 124, and a number of blocks (or circuits) 126a-126n. The block 122 may be implemented as a switch, a multiplexer, or other data routing device. The block 124 may implement a merging buffer comprising a plurality of banks. The blocks 126a-126n may implement two-bank DRAM data buffers. In an example, input packets are generally steered alternately to one of the encoders 120a and 120b. In an example, the switch, multiplexer, or other routing device 122 may alternately route incoming packets to the encoders 120a and 120b in response to a control signal (e.g., EVEN/ODD PACKET). The outputs of the encoders 120a and 120b are alternately stored in respective banks of the merging buffer 124. In an example, the outputs of the encoders 120a and 120b are generally stored with channel ID and length information in each bank of the merging buffer 124. The order of the packets is generally restored by the merging buffer 124 and compressed streams are appended to respective two-bank DRAM buffers 126a-126n of each channel. Once a particular DRAM buffer 126a-126n accumulates one packet to write, a DRAM request may be issued. In an example, the buffers 126a-126n may be part of the buffers 116a of FIG. 2.

Figure 4:
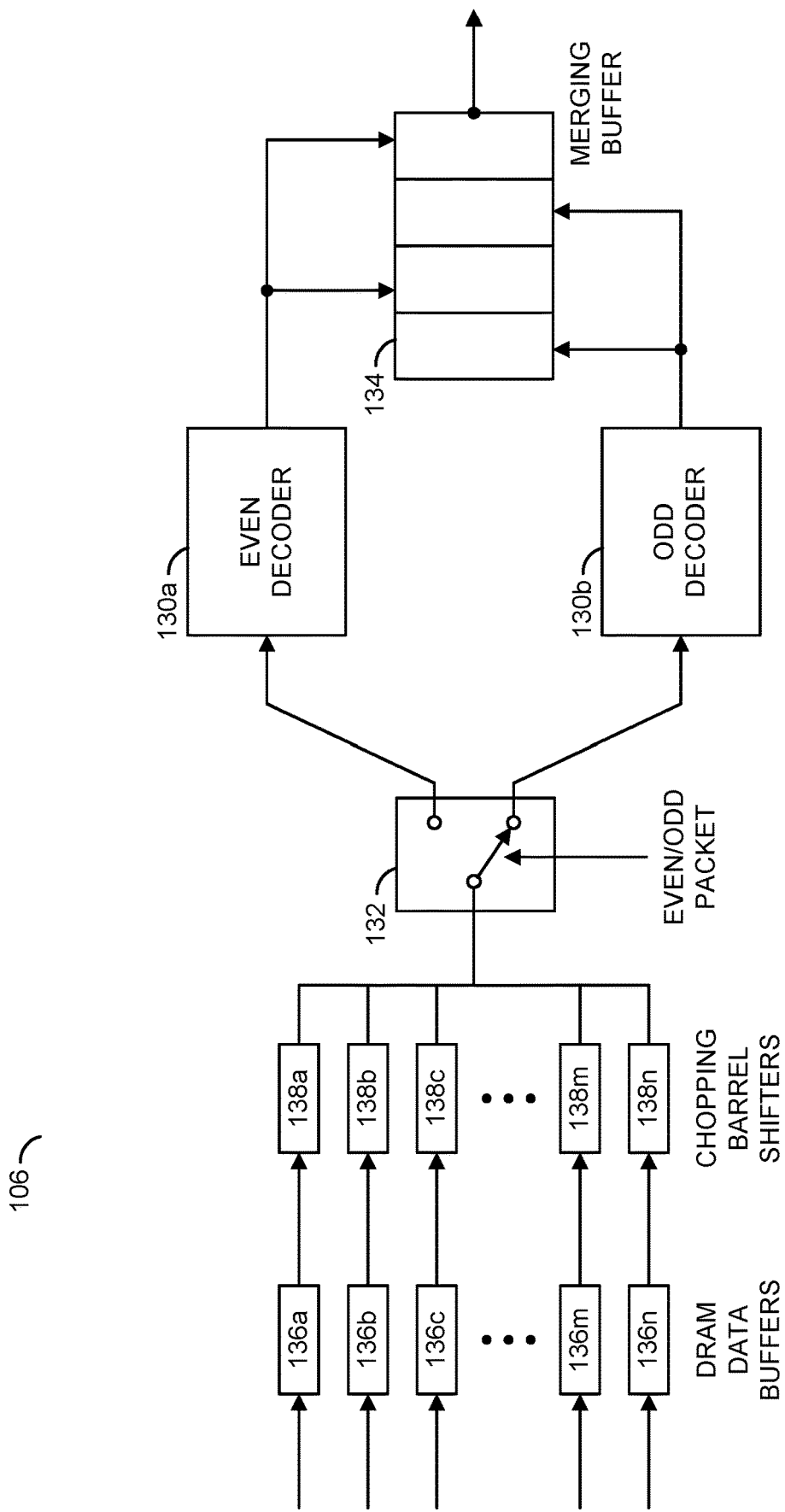
FIG. 4 is a diagram illustrating an example implementation of a decompression unit of FIG. 2 in accordance with an example embodiment of the invention.

Referring to FIG. 4, a diagram is shown illustrating an example implementation of the decompression unit 106 of FIG. 2 in accordance with an example embodiment of the invention. Typically, a decoding (decompression) process takes 16 cycles. In an example, the decompression unit 106 may be implemented with two decoders 130a and 130b. The decoders 130a and 130b may be operated in parallel. In various embodiments, the decompression unit 106 may also comprise a block (or circuit) 132, a block (or circuit) 134, a number of blocks (or circuits) 136a-136n, and a number of blocks (or circuits) 138a-138n. The block 132 may be implemented as a switch, a multiplexer, or other data routing device. The block 134 may implement a merging buffer comprising a plurality of banks. The blocks 136a-136n may implement two-bank DRAM data buffers. The blocks 138a-138n may implement chopping barrel shifters.

In an example, the block 132 may alternately route incoming packets to the decoders 130a and 130b in response to the control signal (e.g., EVEN/ODD PACKET). The outputs of the decoders 130a and 130b are alternately stored in respective banks of the merging buffer 134. In an example, the outputs of the decoders 130a and 130b are generally stored with channel ID and length information in each bank of the merging buffer 134. The order of the packets is generally restored by the merging buffer 134 and the decompressed streams are sent for further processing.

In an example, the two decoders 130a and 130b, the circuit 132, and the merging buffer 134 may be instantiated to meet a desired throughput specification. In a steady state, the two decoders 130a and 130b may start staggered (e.g., 8 cycles apart). In an example, the incoming DRAM stream is generally variable length and is buffered for each channel by a plurality of the DRAM data buffers 136a-136n. In an example, the data buffers 136a-136n may be part of the buffers 116b of FIG. 2. In an example, read pointers of each channel may be kept in the plurality of chopping barrel shifters 138a-138n.

Figure 5:
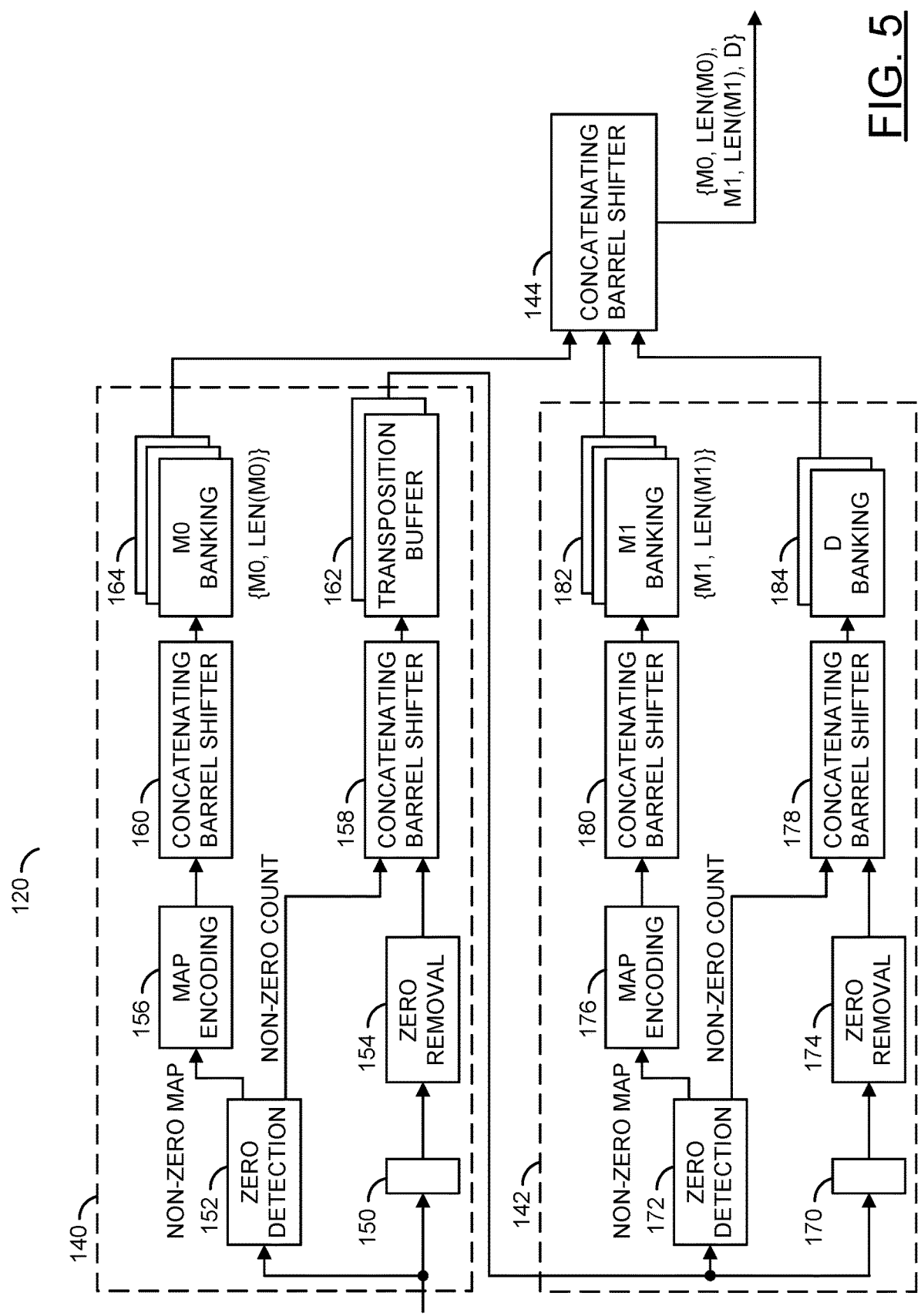
FIG. 5 is a diagram illustrating an example implementation of an encoder of FIG. 3 in accordance with an example embodiment of the invention.

Referring to FIG. 5, a diagram of a circuit 120 is shown illustrating an example implementation of an encoder (compression) circuit in accordance with an example embodiment of the invention. In an example, the encoders 120a and 120b of FIG. 3 may be implemented using the circuit 120. In various embodiments, the circuit 120 may comprise three pipeline stages; a first stage 140, a second stage 142, and a third stage 144. Banking buffers may be inserted between each of the stages. The first stage 140 is generally configured to (i) remove zero elements (e.g., elements with a value of zero) from the input stream and (ii) calculate an element map (e.g., $M_0$). The element map $M_0$ generally indicates the position of each zero element. The remaining non-zero elements are generally stored (e.g., in flip-flops, or other types of memory). The second stage 142 is generally configured to (i) read the stored non-zero elements in transposed order, (ii) remove zero bytes (e.g., bytes with a value of zero), and (iii) calculate a byte map (e.g., $M_1$). The byte map $M_1$ generally indicates the position of each zero byte. Any remaining non-zero bytes are then stored as an array (e.g., D). The third stage 144 is generally configured to concatenate all three parts (e.g., $\{M_0, M_1, D\}$). In an example, the third stage 144 may be implemented as a concatenating barrel shifter.

In an example, the first stage 140 may comprise a block (or circuit) 150, a block (or circuit) 152, a block (or circuit) 154, a block (or circuit) 156, a block (or circuit) 158, a block (or circuit) 160, a block (or circuit) 162, and a block (or circuit) 164. The block 150 may comprise a delay buffer (e.g., a number of flip-flops, or other types of memory). The block 152 may implement a zero detection circuit. The block 154 may implement a zero element removal circuit. The block 156 may implement a map encoding circuit. The block 158 may implement a concatenating barrel shifter circuit. The block 160 may implement a concatenating barrel shifter circuit. The block 162 may implement a transposition buffer. The block 164 may bank the element map $M_0$ and a value (e.g., $LEN(M_0)$) describing a length of the element map $M_0$.

The second stage 142 may comprise a block (or circuit) 170, a block (or circuit) 172, a block (or circuit) 174, a block (or circuit) 176, a block (or circuit) 178, a block (or circuit) 180, a block (or circuit) 182, and a block (or circuit) 184. The block 170 may comprise a delay buffer (e.g., a number of flip-flops, or other types of memory). The block 172 may implement a zero detection circuit. The block 174 may implement a zero byte removal circuit. The block 176 may implement a map encoding circuit. The block 178 may implement a concatenating barrel shifter circuit. The block 180 may implement a concatenating barrel shifter circuit. The block 162 may bank the element map $M_1$ and a value (e.g., $LEN(M_1)$) describing a length of the element map $M_1$. The block 164 may bank the array D containing any remaining non-zero bytes.

In an example, the input stream is presented to an input of the delay buffer 150 and an input of the zero detection circuit 152. An output of the delay buffer 150 is presented to an input of the zero removal circuit 154. The circuit 152 calculates a non-zero map and a non-zero count. The circuit 152 presents the non-zero map to an input of the map encoding circuit 156 and presents the non-zero count to a first input of the concatenating barrel shifter 158. An output of the zero removal circuit is presented to a second input of the concatenating barrel shifter 158. An output of the map encoding block 156 is presented to an input of the concatenating barrel shifter 160. An output of the concatenating barrel shifter 158 is presented to an input of the transposition buffer 162. An output of the concatenating barrel shifter 160 is presented to an input of the banking circuit 164. An output of the banking circuit 164 is presented to a first input of the concatenating barrel shifter 144.

An output of the transposition buffer is presented to an input of the delay buffer 170 and an input of the zero detection circuit 172. An output of the delay buffer 170 is presented to an input of the zero removal circuit 174. The circuit 172 calculates a non-zero map and a non-zero count for the data received from the transposition buffer 172. The circuit 172 presents the non-zero map to an input of the map encoding circuit 176 and presents the non-zero count to a first input of the concatenating barrel shifter 178. An output of the zero removal circuit 174 is presented to a second input of the concatenating barrel shifter 178. An output of the map encoding block 176 is presented to an input of the concatenating barrel shifter 180. An output of the concatenating barrel shifter 178 is presented to an input of the banking circuit 184. An output of the concatenating barrel shifter 180 is presented to an input of the banking circuit 182. An output of the banking circuit 182 is presented to a second input of the concatenating barrel shifter 144. An output of the banking circuit 184 is presented to a third input of the concatenating barrel shifter 144. An output of the concatenating barrel shifter 144 presents the concatenated data (e.g., {$M_0$, LEN($M_0$), $M_1$, LEN($M_1$), D}).

Figure 6:
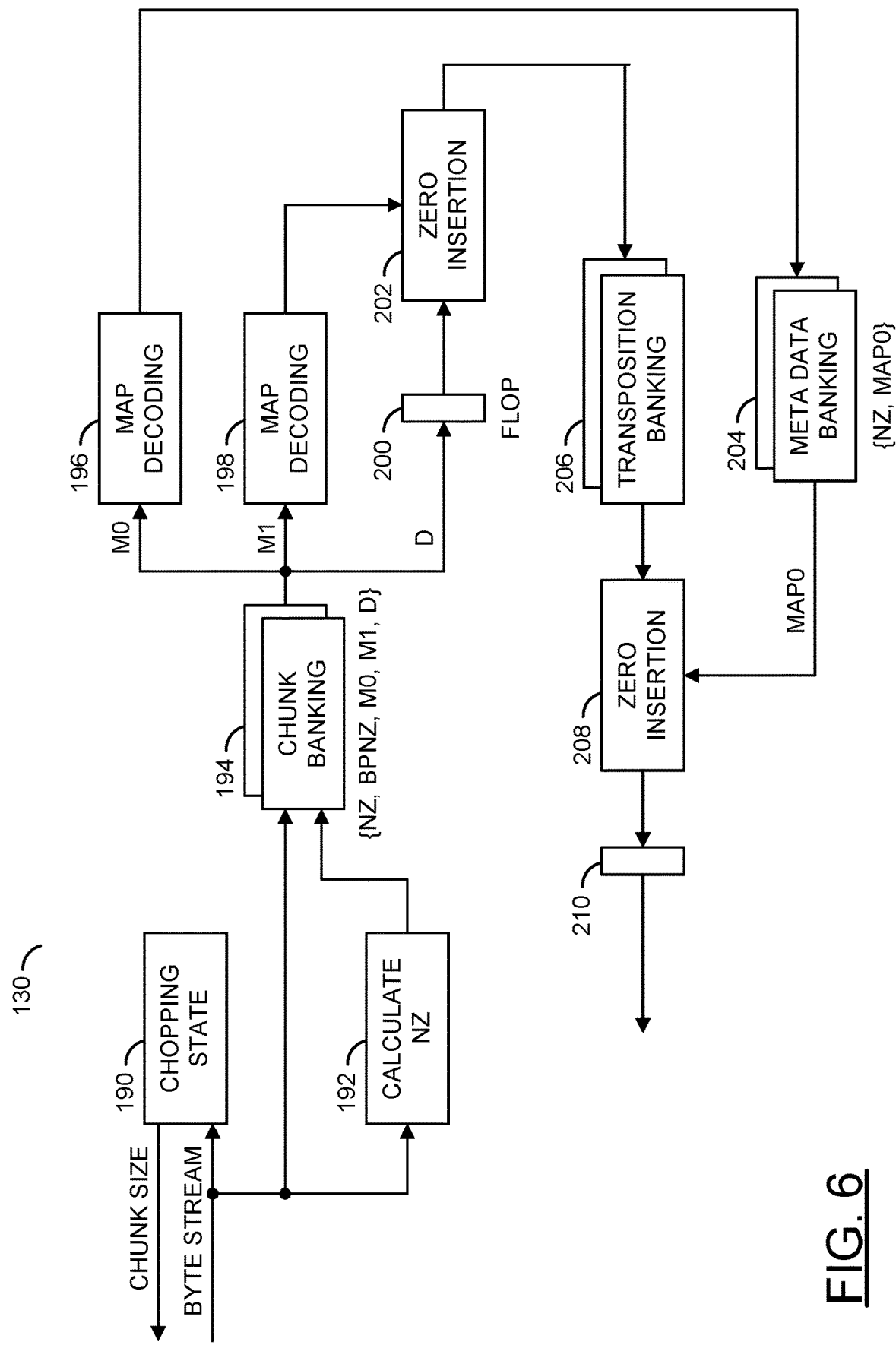
FIG. 6 is a diagram illustrating an example implementation of a decoder of FIG. 4 in accordance with an example embodiment of the invention.

Referring to FIG. 6, a diagram of a circuit 130 is shown illustrating an example implementation of a decoder (decompression) circuit in accordance with an example embodiment of the invention. In an example, the circuit 130 may be used to implement the decoders 130a and 130b of FIG. 4. In an example, the circuit 130 may comprise a block (or circuit) 190, a block (or circuit) 192, a block (or circuit) 194, a block (or circuit) 196, a block (or circuit) 198, a block (or circuit) 200, a block (or circuit) 202, a block (or circuit) 204, a block (or circuit) 206, a block (or circuit) 208, and a block (or circuit) 210. The block 190 implements a chopping module. The block 192 implements a non-zero (NZ) calculation module. The block 194 implements chunk banking modules. The block 196 implements a map decoding module. The block 198 implements a map decoding module. The block 200 implements a delay buffer (e.g., a number of flip-flops, or other type of memory). The block 202 implements a zero insertion module. The block 204 implements a number of meta data banking modules. The block 206 implements a number of transposition banking modules. The block 208 implements a zero insertion module. The block 210 implements an output buffer.

In an example, an input byte stream is presented to an input of the chopping module 190, an input of the NZ calculation module 192, and a first input of the chunk banking modules 194. In a first step, the incoming byte stream is chopped into pieces corresponding to the element map $M_0$, the byte map $M_1$, and the remaining non-zero bytes D. In an example, the length of each chunk is included in the stream, and precedes the respective chunk. Once the chunks are separated, each chunk may be processed in parallel. Bit maps are decoded. Non-zero bytes are transposed, and zero elements are inserted.

The NZ calculation module 192 analyzes the header (first few bytes) of input stream, and determines the number of non-zeros (NZ), number of Bit Plane Zeros (BPNZ), and the length of the packet containing the element map $M_0$, the byte map $M_1$, and the remaining non-zero bytes D. Then the input stream is generally demultiplexed into the chunk banking modules 194. In an example, the element map $M_0$, the byte map $M_1$, and the remaining non-zero bytes D are placed into different banks. The module 194 then distributes the element map $M_0$ to the map decoding module 196, the byte map $M_1$ to the map decoding module 198, and the remaining non-zero bytes D to the buffer 200. The map decoding module 196 decodes the element map $M_0$. The map decoding module 198 decodes the byte map $M_1$. The element map $M_0$ and the byte map $M_1$ are generally decoded separately.

The map decoding module 196 presents the decoded element map $M_0$ to an input of the meta data banking module 204. The map decoding module 198 presents the decoded byte map $M_1$ to a first input of the zero insertion module 202. The buffer 200 presents any remaining non-zero bytes to a second input of the zero insertion module 202. The zero insertion module 202 recovers the transposed bit plane data by inserting zeros into the non-zero values according to the decoded byte map $M_1$. The recovered bit plane data is then transposed by the transposition banking module 206 and presented to a first input of the zero insertion module 208. The meta data banking module 204 presents the decoded element map $M_0$ to a second input of the zero insertion module 208. The zero insertion module 208 inserts zeros according to decoded element map $M_0$. Thus, the whole data block may be losslessly recovered. The recovered data block is then buffered by the buffer module 210 for subsequent processing (e.g., in a CNN).

Figure 7:
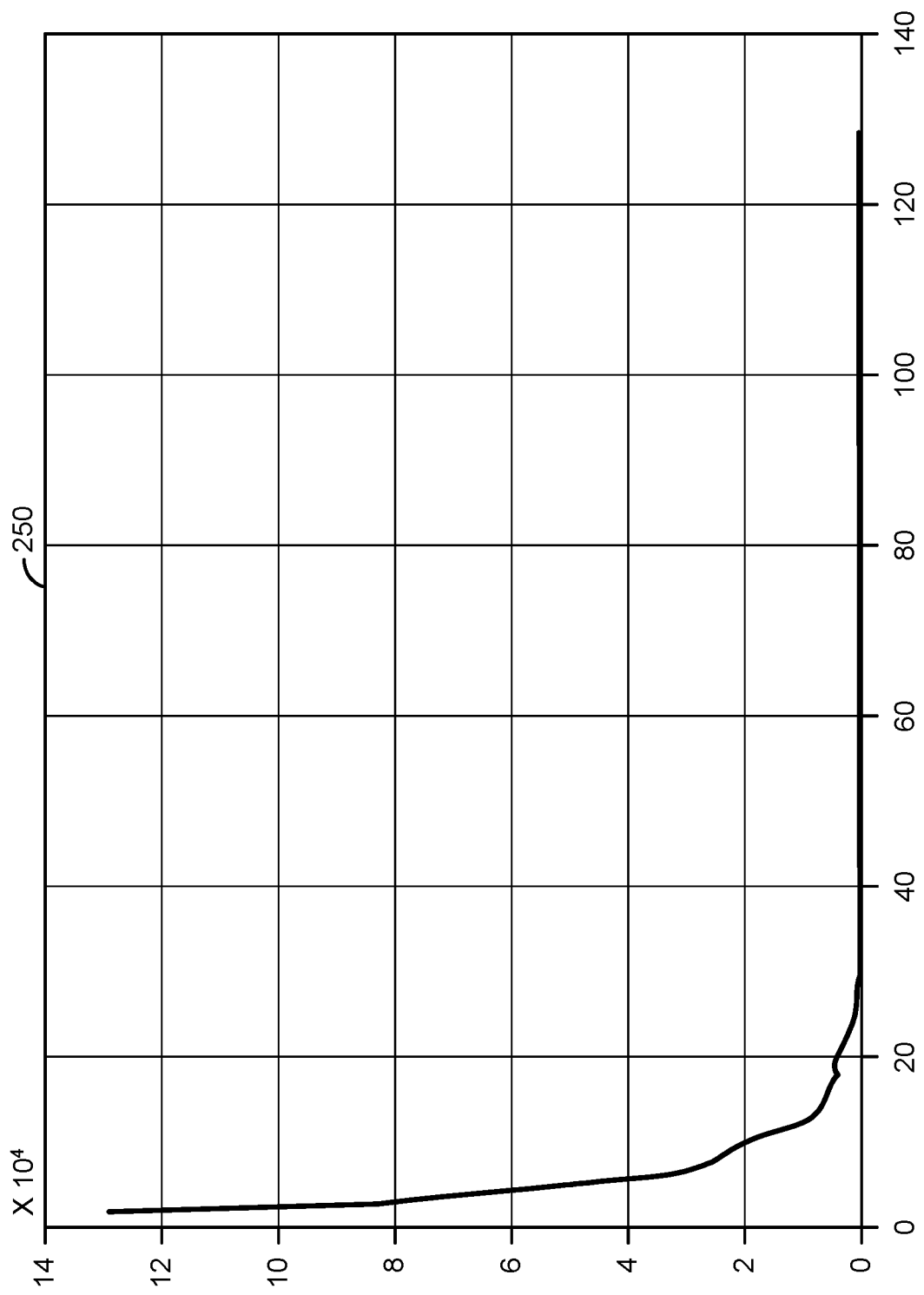
FIG. 7 is a diagram illustrating a histogram of an activation map of one inception layer of VGG Net.

Referring to FIG. 7, a diagram is shown illustrating a histogram 250 of an activation map of one inception layer of VGG Net. To reduce the computation complexity of a CNN, sparse kernels have been largely adopted. Combined with non-linear activation functions, a large portion of the activation map becomes zeroes. As shown by the histogram 250, the activation map may be heavily distributed near zeros.

In various embodiments, a process is provided that takes advantage of redundancies in the intermediate CNN data:
 1. Large amount of zeros; and
 2. Dominant small magnitude values, only non-zero bits at MSB (most significant bit) positions.

Common compression techniques such as run length coding and entropy coding have data dependencies at decompression time (e.g., a previous data element needs to be fully available before decompressing a current data element). Conventional compression techniques cannot maintain such a high throughput as decoding 16 data elements within one cycle.

Figure 8:
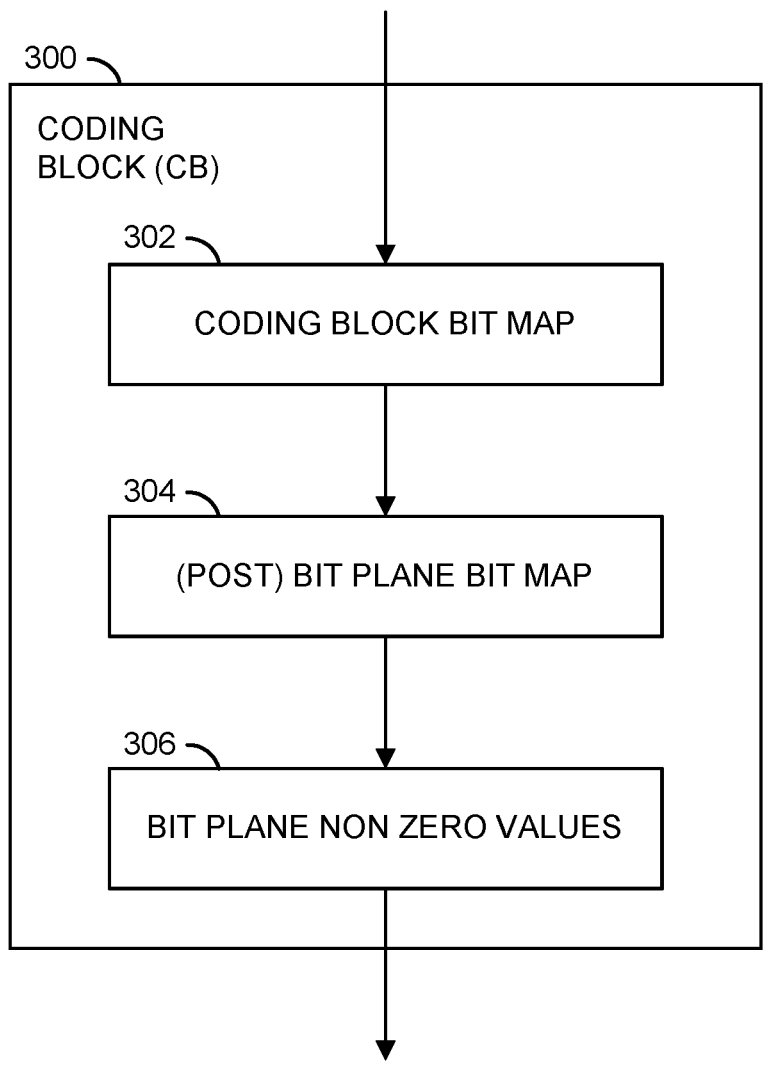
FIG. 8 is a diagram illustrating an example coding block structure in accordance with an example embodiment of the invention.

Referring to FIG. 8, a diagram is shown illustrating an example of a bitmap encoded coding block (CB) in accordance with an example embodiment of the invention. In various embodiments, a two layered bit map plus bit plane encoding scheme is implemented to maintain high throughput with a high compression ratio. The bit plane encoding scheme generally provides a lossless compression. In various embodiments, input data, which are either signed or unsigned input vectors, are grouped into a fixed size coding unit (or coding block) of 128-bytes. Each coding block (CB) generally has 128 8-bit elements or 64 16-bit elements. The compression of each coding block is generally composed of three steps. In a first step, a coding block bit map 302 is created of the zero/non-zero status of each element. For 128 elements, 128 bits are utilized. The bitmap is then further encoded. In a second step, for all the non-zero values in the Coding Block, the non-zero values are reordered in bit-planes. If an element is signed, the element is changed to sign-magnitude representation. A value of "1" is then subtracted from the original value of the element. The values are then scanned in bit planes from MSB (Most Significant Bits) to LSB (Least significant bits). By grouping the values into bit planes, high bit plane (MSBs) generates certain amount of zeros. In a third step, bit plane non-zero values (BPNZs) are encoded. In an example, a zero/non-zero bit map 304 of each BPNZ is encoded, using the same techniques as in the first step. A block 306 of the raw non-zero values is then appended after the bit map 304.

In various embodiments, the compressed representation of the coding block comprises a coding block bit map (e.g., $M_0$) 302, a bit plane bit map (e.g., $M_1$) 304, and zero or more bit plane non-zero values (e.g., D) 306. The bitmaps $M_0$ and $M_1$ identify which positions are non-zeros. Signed elements may be represented in sign-magnitude format. Since the signed elements are non-zero, a one is further subtracted from the original value to have more zeros. During decompression, a one is added back in order to recover the original magnitudes.

Figure 9:
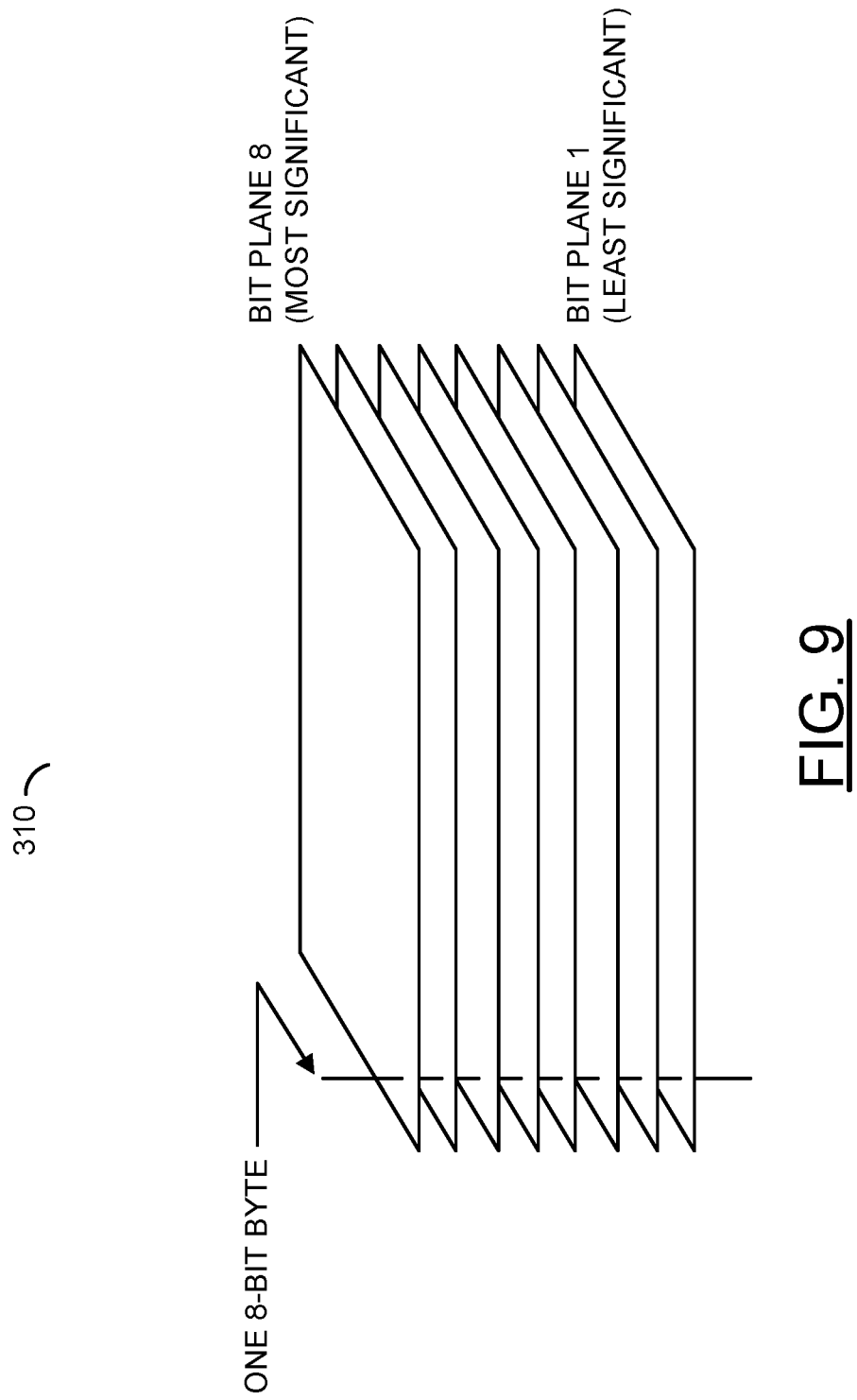
FIG. 9 is a diagram illustrating bit plane re-ordering of input zero values in accordance with an example embodiment of the invention.

Referring to FIG. 9, a diagram of a set of bit planes 310 is shown illustrating bit plane re-ordering of input zero values. After the subtraction operation, the values are scanned bit-plane wise. In an example, the values are transposed/re-ordered, so that large portions of zeros may be generated in MSB bit planes due to the fact that most values are small in magnitude. In case the number of elements is not a multiple of 8, zeros are padded at the end to make sure each bit plane has a size of even bytes. The re-ordered data bytes are then further encoded using bitmaps plus non-zero values.

Figure 10A:
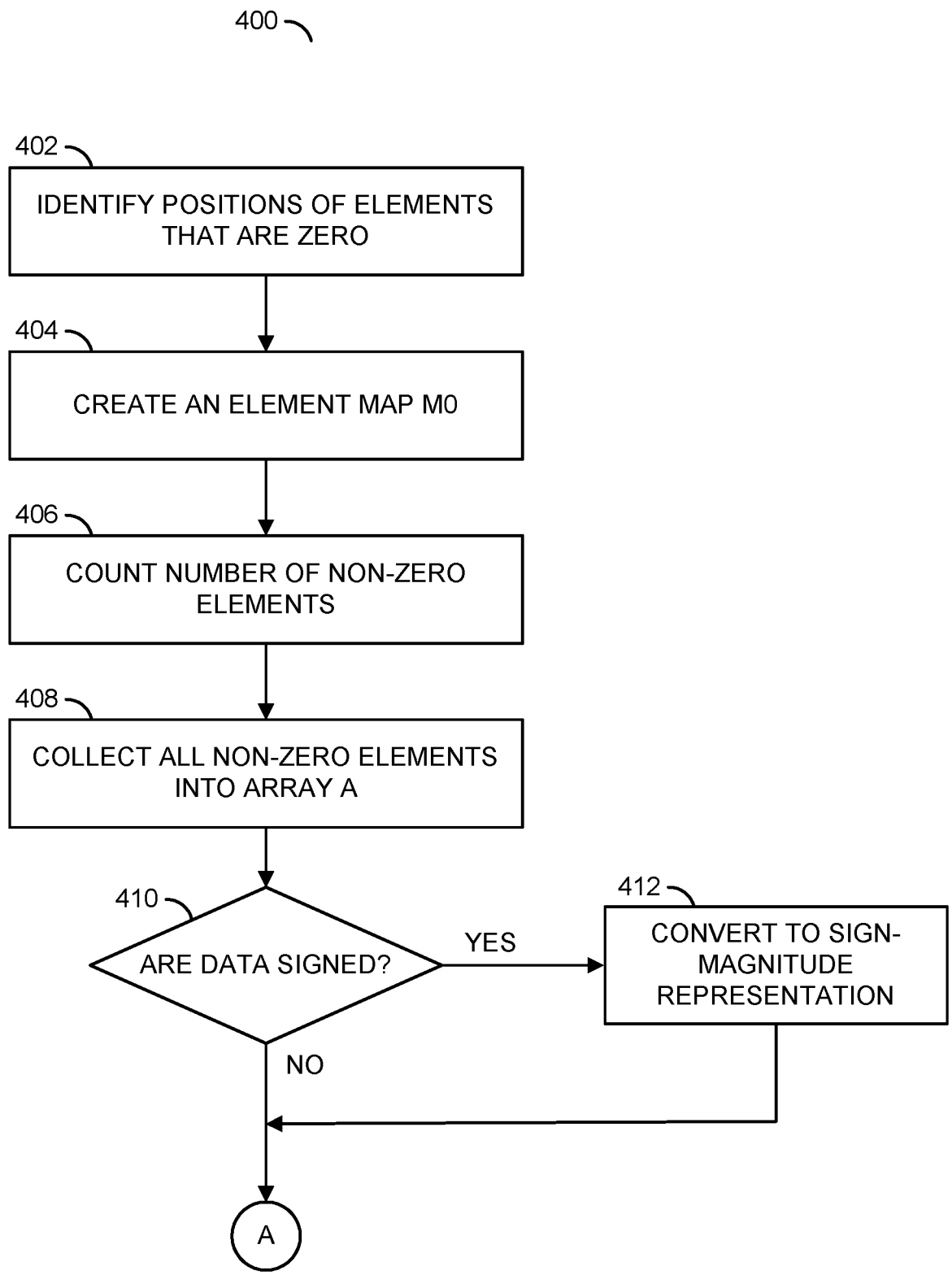
FIGS. 10A-10B are flow diagrams illustrating a compression scheme in accordance with an example embodiment of the invention.
Figure 10B:
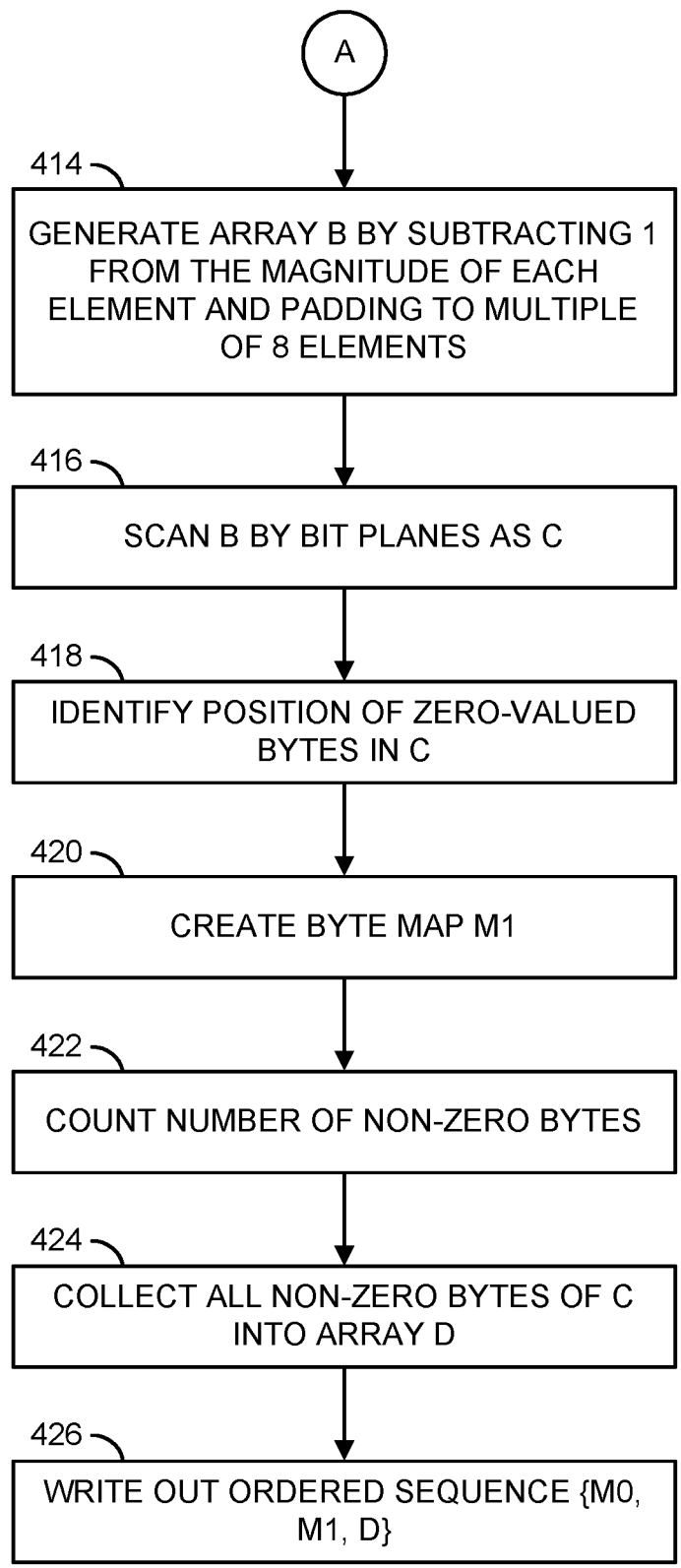

Referring to FIGS. 10A-10B, flow diagrams are shown illustrating a compression scheme in accordance with an example embodiment of the invention. In an example, a process (or method) 400 may implement the compression scheme in accordance with an example embodiment of the invention. In an example, the process 400 may comprise a step (or state) 402, a step (or state) 404, a step (or state) 406, a step (or state) 408, a step (or state) 410, a step (or state) 412, a step (or state) 414, a step (or state) 416, a step (or state) 418, a step (or state) 420, a step (or state) 422, a step (or state) 424, and a step (or state) 426. In various embodiments, input data of the compression scheme may comprise either signed or unsigned elements. In an example, each input data element may be either 8-bits wide or 16-bits wide. In an example, the data stream may be chopped into fixed 128-byte packets. If the input data elements are 8-bits wide, each packet generally contains 128 elements. If the data elements are 16-bits wide, each packet generally contains 64 elements. In an example, the process 400 may be performed for each packet.

In the step 402, the process 400 may identify the position of elements that are zero. In the step 404, the process 400 may create an element map, $M_0$, that indicates the position of each of the elements that are zero. In the step 406, the process 400 may generate a count (e.g., NZ) of the number of non-zero elements. In the step 408, the process 400 may collect all of the non-zero elements into an array (e.g., A) of NZ elements. In the step 410, the process 400 may determine whether the data are signed. When the data are signed, the process 400 may move to the step 412. When the data are not signed, the process 400 may move to the step 414. In the step 412, the process 400 may convert each element in the array A to sign-magnitude representation. When the conversion is complete, the process 400 may move to the step 414.

In the step 414, the process 400 may generate an array (e.g., B) by subtracting 1 from the magnitude of each element in the array A and padding to a multiple of 8 elements. In an example, the step 414 may be summarized as follows:

$B_i = \{sign(A_1)*(abs(A_i)-1), \text{ if } i<size(A)$ 0, otherwise.
When the array B has been generated, the process 400 may move to the step 416. In the step 416, an array (e.g., C) is generated by scanning the array B by bit planes. In an example, the least significant bit (LSB) of all elements goes into C first, followed by the next bits of all elements in the order of significance. Each element in C is generally one byte. The process 400 then continues with the step 418.

In the step 418, the process 400 identifies the position of zero-valued bytes in the array C. In the step 420, the process 400 creates a byte map (e.g., $M_1$) that indicates the position of each zero-valued byte in the array C. In the step 422, the process 400 may generate a count (e.g., BPNZ) of the number of non-zero bytes. In the step 424, the process 400 may collect all of the non-zero bytes of the array C into an array (e.g., D) of BPNZ bytes. In the step 426, the process 400 may write out an ordered sequence $\{M_0, M_1, D\}$. For every 4 packets, the process 400 may calculate a Fletcher checksum over those 4 packets. The 32-bit checksum may be written before the next 4 packets start.

Figure 11:
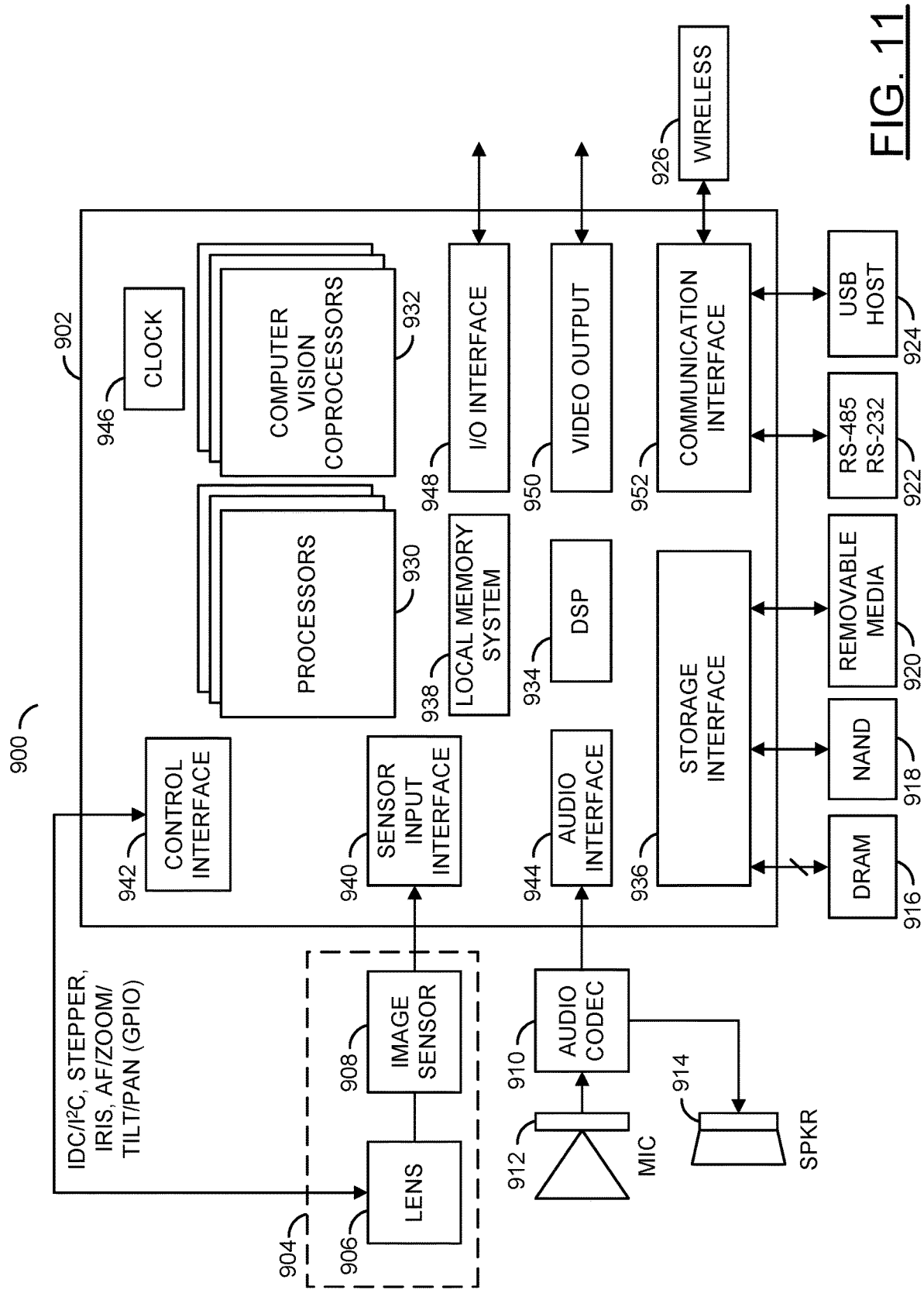
FIG. 11 is a diagram illustrating a camera system incorporating a high throughput hardware unit providing efficient lossless data compression in convolution neural networks in accordance with an embodiment of the invention.

Referring to FIG. 11, a diagram of a camera system 900 is shown illustrating an example implementation of a computer vision system in accordance with an embodiment of the invention. In one example, the electronics of the camera system 900 may be implemented as one or more integrated circuits. In an example, the camera system 900 may be built around a processor/camera chip (or circuit) 902. In an example, the processor/camera chip 902 may be implemented as an application specific integrated circuit (ASIC) or system on chip (SOC). The processor/camera circuit 902 generally incorporates hardware and/or software/firmware that may be configured to implement the processors, circuits, and processes described above in connection with FIG. 1 through FIG. 6.

In an example, the processor/camera circuit 902 may be connected to a lens and sensor assembly 904. In some embodiments, the lens and sensor assembly 904 may be a component of the processor/camera circuit 902 (e.g., a SoC component). In some embodiments, the lens and sensor assembly 904 may be a separate component from the processor/camera circuit 902 (e.g., the lens and sensor assembly may be an interchangeable component compatible with the processor/camera circuit 902). In some embodiments, the lens and sensor assembly 904 may be part of a separate camera connected to the processor/camera circuit 902 (e.g., via a video cable, a high definition media interface (HDMI) cable, a universal serial bus (USB) cable, an Ethernet cable, or wireless link).

The lens and sensor assembly 904 may comprise a block (or circuit) 906 and/or a block (or circuit) 908. The circuit 906 may be associated with a lens assembly. The circuit 908 may be an image sensor. The lens and sensor assembly 904 may comprise other components (not shown). The number, type and/or function of the components of the lens and sensor assembly 904 may be varied according to the design criteria of a particular implementation.

The lens assembly 906 may capture and/or focus light input received from the environment near the camera 60. The lens assembly 906 may capture and/or focus light for the image sensor 908. The lens assembly 906 may implement an optical lens. The lens assembly 906 may provide a zooming feature and/or a focusing feature. The lens assembly 906 may be implemented with additional circuitry (e.g., motors) to adjust a direction, zoom and/or aperture of the lens assembly 906. The lens assembly 906 may be directed, tilted, panned, zoomed and/or rotated to provide a targeted view of the environment near the camera 60.

The image sensor 908 may receive light from the lens assembly 906. The image sensor 908 may be configured to transform the received focused light into digital data (e.g., bitstreams). In some embodiments, the image sensor 908 may perform an analog to digital conversion. For example, the image sensor 908 may perform a photoelectric conversion of the focused light received from the lens assembly 906. The image sensor 908 may present converted image data as a color filter array (CFA) formatted bitstream. The processor/camera circuit 902 may transform the bitstream into video data, video files and/or video frames (e.g., human-legible content).

The processor/camera circuit 902 may also be connected to (i) an optional audio input/output circuit including an audio codec 910, a microphone 912, and a speaker 914, (ii) a memory 916, which may include dynamic random access memory (DRAM), (iii) a nonvolatile memory (e.g., NAND flash memory) 918, a removable media (e.g., SD, SDXC, etc.) 920, one or more serial (e.g., RS-485, RS-232, etc.) devices 922, one or more universal serial bus (USB) devices (e.g., a USB host) 924, and a wireless communication device 926.

In various embodiments, the processor/camera circuit 902 may comprise a number of blocks (or circuits) 930, a number of blocks (or circuits) 932, a block (or circuit) 934, a block (or circuit) 936, a block (or circuit) 938, a block (or circuit) 940, a block (or circuit) 942, a block (or circuit) 944, a block (or circuit) 946, a block (or circuit) 948, a block (or circuit) 950, and/or a block (or circuit) 952. The number of circuits 930 may be processor circuits. In various embodiments, the circuits 930 may include one or more embedded processors (e.g., ARM, etc.). The circuits 932 may implement a number of computer vision related coprocessor circuits. The circuit 934 may be a digital signal processing (DSP) module. In some embodiments, the circuit 934 may implement separate image DSP and video DSP modules. The circuit 936 may be a storage interface. The circuit 936 may interface the processor/camera circuit 902 with the DRAM 916, the non-volatile memory 918, and the removable media 920.

The circuit 938 may implement a local memory system. In some embodiments, the local memory system 938 may include, but is not limited to a cache (e.g., L2CACHE), a direct memory access (DMA) engine, graphic direct memory access (GDMA) engine, and fast random access memory. In an example, the circuit 938 may implement a high throughput hardware unit providing efficient lossless data compression in convolution neural networks implemented by the block 932. The circuit 940 may implement a sensor input (or interface). The circuit 942 may implement one or more control interfaces including but not limited to an inter device communication (IDC) interface, an inter integrated circuit ($I^2C$) interface, a serial peripheral interface (SPI), and a pulse width modulation (PWM) interface. The circuit 944 may implement an audio interface (e.g., an $I^2S$ interface, etc.). The circuit 946 may implement a clock circuit including but not limited to a real time clock (RTC), a watchdog timer (WDT), and/or one or more programmable timers. The circuit 948 may implement an input/output (I/O) interface. The circuit 950 may be a video output module. The circuit 952 may be a communication module. The circuits 930 through 952 may be connected to each other using one or more buses, interfaces, traces, protocols, etc.

The circuit 918 may be implemented as a nonvolatile memory (e.g., NAND flash memory, NOR flash memory, etc.). The circuit 920 may comprise one or more removable media cards (e.g., secure digital media (SD), secure digital extended capacity media (SDXC), etc.). The circuit 922 may comprise one or more serial interfaces (e.g., RS-485, RS-232, etc.). The circuit 924 may be an interface for connecting to or acting as a universal serial bus (USB) host. The circuit 926 may be a wireless interface for communicating with a user device (e.g., a smart phone, a computer, a tablet computing device, cloud resources, etc.). In various embodiments, the circuits 904-926 may be implemented as components external to the processor/camera circuit 902. In some embodiments, the circuits 904-926 may be components on-board the processor/camera circuit 902.

The control interface 942 may be configured to generate signals (e.g., IDC/I2C, STEPPER, IRIS, AF/ZOOM/TILT/PAN, etc.) for controlling the lens and sensor assembly 904. The signal IRIS may be configured to adjust an iris for the lens assembly 906. The interface 942 may enable the processor/camera circuit 902 to control the lens and sensor assembly 904.

The storage interface 936 may be configured to manage one or more types of storage and/or data access. In one example, the storage interface 936 may implement a direct memory access (DMA) engine and/or a graphics direct memory access (GDMA). In another example, the storage interface 936 may implement a secure digital (SD) card interface (e.g., to connect to the removable media 920). In various embodiments, programming code (e.g., executable instructions for controlling various processors and encoders of the processor/camera circuit 902) may be stored in one or more of the memories (e.g., the DRAM 916, the NAND 918, etc.). When executed by one or more of the processors 930, the programming code generally causes one or more components in the processor/camera circuit 902 to configure video synchronization operations and start video frame processing operations. The resulting compressed video signal may be presented to the storage interface 936, the video output 950 and/or communication interface 952. The storage interface 936 may transfer program code and/or data between external media (e.g., the DRAM 916, the NAND 918, the removable media 920, etc.) and the local (internal) memory system 938.

The sensor input 940 may be configured to send/receive data to/from the image sensor 908. In one example, the sensor input 940 may comprise an image sensor input interface. The sensor input 940 may be configured to transmit captured images (e.g., picture element, pixel, data) from the image sensor 908 to the DSP module 934, one or more of the processors 930 and/or one or more of the coprocessors 932. The data received by the sensor input 940 may be used by the DSP 934 to determine a luminance (Y) and chrominance (U and V) values from the image sensor 908. The sensor input 940 may provide an interface to the lens and sensor assembly 904. The sensor input interface 940 may enable the processor/camera circuit 902 to capture image data from the lens and sensor assembly 904.

The audio interface 944 may be configured to send/receive audio data. In one example, the audio interface 944 may implement an audio inter-IC sound ($I^2S$) interface. The audio interface 944 may be configured to send/receive data in a format implemented by the audio codec 910.

The DSP module 934 may be configured to process digital signals. The DSP module 934 may comprise an image digital signal processor (IDSP), a video digital signal processor DSP (VDSP) and/or an audio digital signal processor (ADSP). The DSP module 934 may be configured to receive information (e.g., pixel data values captured by the image sensor 908) from the sensor input 940. The DSP module 934 may be configured to determine the pixel values (e.g., RGB, YUV, luminance, chrominance, etc.) from the information received from the sensor input 940. The DSP module 934 may be further configured to support or provide a sensor RGB to YUV raw image pipeline to improve image quality, bad pixel detection and correction, demosaicing, white balance, color and tone correction, gamma correction, adjustment of hue, saturation, brightness and contrast adjustment, chrominance and luminance noise filtering.

The I/O interface 948 may be configured to send/receive data. The data sent/received by the I/O interface 948 may be miscellaneous information and/or control data. In one example, the I/O interface 948 may implement one or more of a general purpose input/output (GPIO) interface, an analog-to-digital converter (ADC) module, a digital-to-analog converter (DAC) module, an infrared (IR) remote interface, a pulse width modulation (PWM) module, a universal asynchronous receiver transmitter (UART), an infrared (IR) remote interface, and/or one or more synchronous data communications interfaces (IDC SPI/SSI).

The video output module 950 may be configured to send video data. For example, the processor/camera circuit 902 may be connected to an external device (e.g., a TV, a monitor, a laptop computer, a tablet computing device, etc.). The video output module 950 may implement a high-definition multimedia interface (HDMI), a PAL/NTSC interface, an LCD/TV/Parallel interface and/or a DisplayPort interface.

The communication module 952 may be configured to send/receive data. The data sent/received by the communication module 952 may be formatted according to a particular protocol (e.g., Bluetooth®, ZigBee®, USB, Wi-Fi, UART, etc.). In one example, the communication module 952 may implement a secure digital input output (SDIO) interface. The communication module 952 may include support for wireless communication by one or more wireless protocols such as Bluetooth®, ZigBee®, Institute of Electrical and Electronics Engineering (IEEE) 802.11, IEEE 802.15, IEEE 802.15.1, IEEE 802.15.2, IEEE 802.15.3, IEEE 802.15.4, IEEE 802.15.5, and/or IEEE 802.20, GSM, CDMA, GPRS, UMTS, CDMA2000, 3GPP LTE, 4G/HSPA/WiMAX, SMS, etc. The communication module 952 may also include support for communicating using one or more of the universal serial bus protocols (e.g., USB 1.0, 2.0, 3.0, etc.). The processor/camera circuit 902 may also be configured to be powered via a USB connection. However, other communication and/or power interfaces may be implemented accordingly to meet the design criteria of a particular application.

The processor/camera circuit 902 may be configured (e.g., programmed) to control the one or more lens assemblies 906 and the one or more image sensors 908. The processor/camera circuit 902 may receive raw image data from the image sensor(s) 908. The processor/camera circuit 902 may encode the raw image data into a plurality of encoded video streams simultaneously (in parallel). The plurality of video streams may have a variety of resolutions (e.g., VGA, WVGA, QVGA, SD, HD, Ultra HD, 4K, etc.). The processor/camera circuit 902 may receive encoded and/or uncoded (e.g., raw) audio data at the audio interface 944. The processor/camera circuit 902 may also receive encoded audio data from the communication interface 952 (e.g., USB and/or SDIO). The processor/camera circuit 902 may provide encoded video data to the wireless interface 926 (e.g., using a USB host interface). The wireless interface 926 may include support for wireless communication by one or more wireless and/or cellular protocols such as Bluetooth®, ZigBee®, IEEE 802.11, IEEE 802.15, IEEE 802.15.1, IEEE 802.15.2, IEEE 802.15.3, IEEE 802.15.4, IEEE 802.15.5, IEEE 802.20, GSM, CDMA, GPRS, UMTS, CDMA2000, 3GPP LTE, 4G/HSPA/WIMAX, SMS, etc. The processor/camera circuit 902 may also include support for communication using one or more of the universal serial bus protocols (e.g., USB 1.0, 2.0, 3.0, etc.).

In various embodiments, to save the inter-layer DRAM traffic, a lossless compression scheme is implemented in which the intermediate data is compressed, while maintaining the high throughput (e.g., 16-byte per cycle) of the on-chip memory system.

The functions and structures illustrated in the diagrams of FIGS. 1 to 11 may be designed, modeled, emulated, and/or simulated using one or more of a conventional general purpose processor, digital computer, microprocessor, microcontroller, distributed computer resources and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally embodied in a medium or several media, for example non-transitory storage media, and may be executed by one or more of the processors sequentially or in parallel.

Embodiments of the present invention may also be implemented in one or more of ASICs (application specific integrated circuits), FPGAs (field programmable gate arrays), PLDs (programmable logic devices), CPLDs (complex programmable logic device), sea-of-gates, ASSPs (application specific standard products), and integrated circuits. The circuitry may be implemented based on one or more hardware description languages. Embodiments of the present invention may be utilized in connection with flash memory, nonvolatile memory, random access memory, read-only memory, magnetic disks, floppy disks, optical disks such as DVDs and DVD RAM, magneto-optical disks and/or distributed storage systems.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
a first memory interface circuit; and
a decompression circuit coupled to said first memory interface circuit, wherein said decompression circuit is configured to (i) receive a reduced size representation of a coding block of data comprising a first bit map, a second bit map, a first value indicating a size of said first bit map, a second value indicating a size of said second bit map, and zero or more non-zero values from an external memory via said first memory interface circuit, (ii) losslessly restore said coding block of data from said reduced size representation of the coding block of data using said first bit map, said second bit map, and said zero or more non-zero values, and (iii) transfer the restored coding block of data to a processing circuit.

2. The apparatus according to claim 1, wherein said decompression circuit comprises a pair of decompression engines operating in parallel and a merging buffer configured to maintain an order of data packets being decompressed.

3. The apparatus according to claim 2, wherein:
said decompression engines comprise a chopping module configured to separate said first bit map, said second bit map and said zero or more non-zero values from a packet containing said reduced size representation of said coding block of data.

4. The apparatus according to claim 3, wherein said decompression engines comprise a pair of map decoding modules operating in parallel to decode said first bit map and said second bit map.

5. The apparatus according to claim 1, further comprising a second memory interface circuit, wherein said decompression circuit is configured to transfer the restored coding block of data to the processing circuit using the second memory interface circuit.

6. The apparatus according to claim 1, wherein said decompression circuit is implemented in hardware circuitry.

7. The apparatus according to claim 1, further comprising a second memory interface circuit and a compression circuit coupled between said first memory interface circuit and said second memory interface circuit, wherein said compression circuit is configured to (i) receive said coding block of data via said second memory interface circuit, (ii) generate said reduced size representation of the coding block of data comprising said first bit map, said second bit map, and said zero or more non-zero values, and (iii) write the reduced size representation of the coding block of data to the external memory using said first memory interface circuit.

8. The apparatus according to claim 7, wherein said compression circuit is further configured to (i) create said first bit map identifying each element in said coding block of data as either a zero or non-zero value, (ii) reorder any non-zero elements into a plurality of bit planes, (iii) reduce a magnitude of said non-zero elements by a predetermined amount, and (iv) create said second bit map identifying each element in said plurality of bit planes as a zero or non-zero value.

9. The apparatus according to claim 7, wherein said compression circuit comprises a pair of compression engines operating in parallel and a merging buffer configured to maintain an order of data packets being compressed.

10. The apparatus according to claim 7, wherein said compression circuit and said decompression circuit improve performance of a neural network by losslessly compressing said coding block of data to reduce an amount of memory bandwidth used to transfer said coding block of data to and from said external memory.

11. The apparatus according to claim 7, wherein said compression circuit and said decompression circuit losslessly compresses and decompresses data of one or more intermediate layers of a convolutional neural network layer in real time.

12. The apparatus according to claim 7, wherein said compression circuit and said decompression circuit are implemented in hardware circuitry.

13. The apparatus according to claim 7, further comprising a checksum calculation block coupled between said compression circuit and said decompression circuit.

14. The apparatus according to claim 13, wherein said checksum calculation block calculates a Fletcher checksum over a predetermined number of packets.

15. The apparatus according to claim 7, wherein said compression circuit and said decompression circuit are part of a computer vision processing system.

16. A method of recovering data from a data structure providing lossless data compression of blocks of data of one or more intermediate layers of a convolutional neural network layer, said method comprising:
retrieving a reduced size representation of a coding block of data comprising a first bit map, a second bit map, a first value indicating a size of said first bit map, a second value indicating a size of said second bit map, and zero or more non-zero values from an external memory via a memory interface circuit;
losslessly restoring said coding block of data from said reduced size representation of the coding block of data using said first bit map, said second bit map, and said zero or more non-zero values; and
transfer the restored coding block of data to a processing circuit.

17. The method according to claim 16, further comprising:
alternately routing incoming data between a pair of decompression engines operating in parallel; and
alternately storing outputs of said pair of decompression engines in respective banks of a merging buffer configured to maintain an order of data packets being decompressed.

18. The method according to claim 17, wherein:
said decompression engines comprise a chopping module configured to separate said first bit map, said second bit map and said zero or more non-zero values from a packet containing said reduced size representation of said coding block of data.

19. The method according to claim 16, wherein losslessly compressing and restoring said data of said one or more intermediate layers of said convolutional neural network layer is performed in real time.

20. The method according to claim 16, wherein said data structure is generated and processed using a hardware engine of a computer vision processing system.

* * * * *